(12) United States Patent
Holmberg (10) Patent No.: US 7,381,906 B2
(45) Date of Patent: Jun. 3, 2008

(54) SHIELDING DEVICE (75) Inventor: Per Holmberg, Dalby (SE)

(73) Assignee: Sony Ericsson Mobile Communications AB (SE)

( * ) Notice: Subject to any disclaimer, the term of this patent is extended or adjusted under 35 U.S.C. 154(b) by 149 days.

(21) Appl. No.: 11/401,630

(22) Filed: Apr. 11, 2006

(65) Prior Publication Data

US 2007/0205019 A1 Sep. 6, 2007

Related U.S. Application Data

(60) Provisional application No. 60/777,971, filed on Mar. 1, 2006.

(51) Int. Cl.
*H05K 9/00* (2006.01)
(52) U.S. Cl. ............ 174/385; 174/384; 174/391; 361/818
(58) Field of Classification Search ............ 174/384, 174/385, 377, 391; 361/816, 818
See application file for complete search history.

(56) References Cited

U.S. PATENT DOCUMENTS

| | | | |
|---|---|---|---|
| 2,454,567 A | * | 11/1948 | Pierson, Jr. ............ 174/351 |
| 4,520,562 A | * | 6/1985 | Sado et al. ............ 29/878 |
| 4,720,606 A | * | 1/1988 | Senn ............ 174/356 |
| 5,763,824 A | * | 6/1998 | King et al. ............ 174/374 |
| 5,898,127 A | * | 4/1999 | Schuhmacher et al. ...... 174/382 |

FOREIGN PATENT DOCUMENTS

| | | |
|---|---|---|
| EP | 1 139 712 A | 10/2001 |
| WO | WO 98/23139 A | 5/1998 |
| WO | WO 98/54942 A | 12/1998 |
| WO | WO 02/052915 A | 7/2002 |

OTHER PUBLICATIONS

International Search Report for International Application No. PCT/EP2006/065970; dated Apr. 6, 2007.

* cited by examiner

*Primary Examiner*—Hung V. Ngo
(74) *Attorney, Agent, or Firm*—Myers Bigel Sibley & Sajovec, P.A.

(57) ABSTRACT

A shielding device configured to provide EMI or ESD protection to an electronic component (80) comprises a cover (83), and a wall (10) of a resilient material. By molding the resilient material under the influence of a magnetic field provided by a number of separate magnets, a dispersed plurality of magnetically attractable particles in the material are concentrated in strings (11) extending between a lower (12) and upper (13) end of the wall. The cover is attached to connect to the strings affixed in the solidified wall at the upper end of the wall, and at the lower end of the wall the strings are placed in contact with a ground trace (82) formed around the component to be shielded, thereby forming a Faraday cage about the component.

11 Claims, 5 Drawing Sheets

SHIELDING DEVICE

CROSS REFERENCE TO RELATED APPLICATION

This application claims the benefit of and priority to U.S. Provisional Patent Application No. 60/777,971, filed Mar. 1, 2006; entitled Shielding Device, the disclosure of which is hereby incorporated herein by reference.

FIELD OF THE INVENTION

The present invention relates to the field of shielding devices for electric and electronic components. Typically, such shielding devices are either used to protect components from electromagnetic radiation or interference (EMI) or electrostatic discharge (ESD), or to protect other components from electromagnetic radiation emitted from the shielded component. More specifically, the invention relates to a shielding device, a method for producing such a shielding device, and a method for shielding a component, wherein a wall of the shielding device is made from a resilient material in which strings of electrically conductive particles are concentrated in strings, extending between an upper wall end and a lower wall end.

BACKGROUND

The mobile phone industry has had an enormous development both regarding quality of service and transmission capabilities, as well as the technology for producing advanced communications terminals. In only a couple of decades the communication systems have gone from analogue to digital, and at the same time the dimensions of the communication terminals have gone from briefcase size to the pocket size phones of today. Still today, mobile phones are getting smaller and smaller and the size is generally considered to be an important factor for the end customer. The development in electronics has made it possible to miniaturize the components of the terminals, at the same time making the terminals capable of performing more advanced functions and services.

Mobile phones communicate by radio, and electromagnetic interference (EMI) will therefore always be an issue to handle. Electromagnetic fields generated from the radio part of the phone may cause interference problems ion the processor part, and vice versa. In order to shield sensitive equipment from electromagnetic radiation, or to protect them from electrostatic discharge, such equipment is often provided with a shielding device in the form of a metal casing or can, enclosing the equipment towards a carrier, typically a printed circuit board (PCB). In general, the can is soldered to the PCB to provide a conductive seam to a support surface on the PCB. An advantage with shield cans is that the cost of the can as such is low. However, a problem related to this method is that if a component below the soldered shield can is to be replaced or removed, the can first needs to be removed by heating and then be re-soldered after finishing the job with the component. This is a time-consuming and costly process.

An alternative solution is to apply a conductive gasket over a conductive trace on a PCB about the equipment to be shielded, and then apply a cover on top of the gasket. Such a conductive gasket may be provided as a string of silicone, in which silver grains are homogenously dispersed. A problem related to this technique is that such conductive gaskets generally are relatively hard. Moreover, they tend to become even harder by ageing. This means that the force needed to obtain sufficient contact between the cover and the conductive trace is quite high. Furthermore, in order to obtain a reasonable softness in the silicone, it cannot comprise a large amount of metal grains, which as such are non-compressible. As a result the contact resistance between the conductive silicone and an engaging surface is relatively low. Furthermore, the material cost for silver-containing silicone is relatively high.

SUMMARY OF THE INVENTION

It is an object of the present invention to provide a shielding device, and a method for producing a shielding device, which is flexible in terms of assembly and disassembly. The invention therefore provides a shielding device and a method for producing the shield device where the shielding device is non-soldered, but still cost effective.

According to a first aspect of the invention, the stated object is fulfilled by means of a shielding device for an electronic component, comprising a wall of a resilient material, having a lower end and an upper end;

a plurality of particles of a magnetically attractable material, concentrated in strings extending within the wall from the lower end to the upper end;

a cover having an electrically conductive layer, connected to the strings at the upper end of the wall.

In one embodiment of the shielding device, the wall encompasses an area, and the cover is engaged to the upper end of the wall around that area.

In one embodiment of the shielding device, the cover is a sheet of metal.

In one embodiment of the shielding device, the electrically conductive layer is made of a non-magnetic metal.

In one embodiment of the shielding device, the cover is adhered to the upper end of the wall by means of a conductive adhesive.

In one embodiment of the shielding device, the cover is pressed into engagement with the upper end of the wall by means of an attachment member.

In one embodiment of the shielding device, the plurality of particles are coated with a conduction-enhancing metal layer.

In one embodiment of the shielding device, the plurality of particles are coated with a layer of gold.

In one embodiment of the shielding device, the plurality of particles are coated with a layer of silver.

In one embodiment of the shielding device, the lower and of the wall has a stepper profile defined by a shoulder, configured to engage a stepped carrier surface.

In one embodiment of the shielding device, the wall encompasses an area, and an interior partition wall member divides the area into two separate sub areas.

According to a second aspect of the invention, the stated object is fulfilled by means of a method for manufacturing a shielding device including a wall and a cover connected to an upper wall end, comprising the steps of:

injecting a moldable material, including a dispersed plurality of particles of a magnetically attractable material, into a mold tool;

providing a magnetic field over the mold tool, such that the particles are concentrated in strings extending within a cavity of the mold tool;

solidifying the molding material to form a resilient wall element, in which the strings are affixed extending from a lower wall end to the upper wall end.

In one embodiment, the method comprises the steps of:
releasing the molded wall from the mold tool;
applying the cover to the solidified wall.

In one embodiment, the method comprises the steps of:
releasing the molded wall from the mold tool;
applying the cover to the solidified wall by means of a conductive adhesive.

In one embodiment, the method comprises the steps of:
releasing the molded wall from the mold tool;
applying the cover to the solidified wall by pressing, such that a conductive layer of the cover is connected to the strings at the upper wall end.

In one embodiment, the method comprises the steps of:
placing the cover in the mold tool;
attaching the wall to the cover in the step of solidifying the molding material;
releasing the molded wall with the attached cover from the mold tool.

According to a third aspect of the invention, the stated object is fulfilled by means of a method for shielding a component, comprising the steps of:
providing a wall of a resilient moldable material, having a lower end and an upper end, in which wall a plurality of particles of a magnetically attractable material are concentrated in strings extending from the lower end to the upper end;
providing a cover having an electrically conductive layer, connected to the strings at the upper end of the wall;
placing the wall on a carrier surface on which a component is attached, such that a ground portion on the carrier surface is connected to the strings at the lower end of the wall.

In one embodiment, the wall and the ground portion encompasses an area in which the component is positioned.

In one embodiment, the method comprises the step of:
attaching the cover to the wall by means of a releasable attachment member configured to press the cover against the upper wall end.

In one embodiment, the method comprises the step of:
attaching the cover to the wall by means of a conductive adhesive.

In one embodiment, the method comprises the step of:
attaching the wall to the carrier surface by means of a releasable attachment member configured to press wall against the ground portion.

BRIEF DESCRIPTION OF THE DRAWINGS

Further features and advantages of the present invention will become more apparent from the following description of preferred embodiments, with reference to the accompanying drawings, on which FIGS. 1 and 2 schematically illustrate a wall forming part of a shielding device according to an embodiment of the invention.

DETAILED DESCRIPTION OF PREFERRED EMBODIMENTS

The present description refers to shielding devices for electronic components, for the purpose of EMI or ESD protection. The invention will in certain aspects be referred to as implemented in a mobile phone, as a shielding device over a circuit attached to a printed circuit board (PCB) of the phone. This should merely be regarded as an example usable for understanding the invention, and not as a limitation to that field of use. More specifically, in any context where there is a need to shield a component or circuit to minimize EMI or to protect the component from ESD, the present invention may be used in a suitable embodiment. Furthermore, it should be emphasized that the term "comprising" or "comprises" when used in this description and in the appended claims to indicate included features, elements or steps, is in no way to be interpreted as excluding the presence of other features, elements or steps than those expressed or stated.

A shielding device according to the invention comprises a wall and a cover, which together form a shielding cavity to be attached to a ground surface to close the cavity, preferably around an electronic component. An embodiment of a shielding device according to the invention will be described, as well as a tool and a method for manufacturing the shielding device, and a method for shielding a component.

Figures 1, 2:
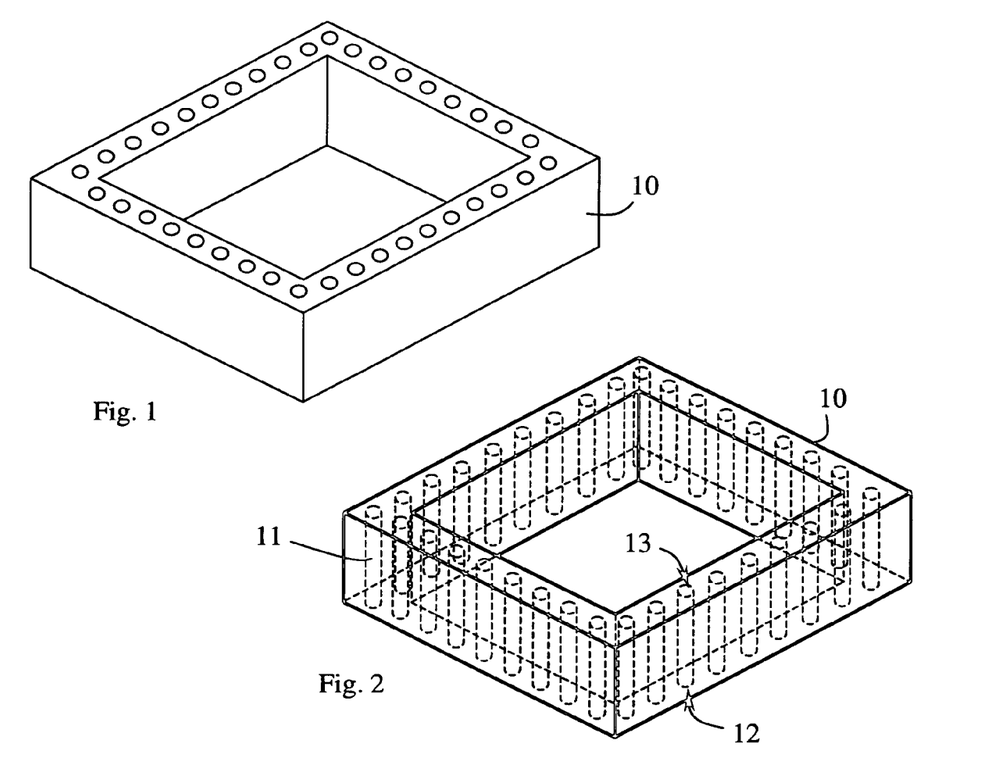

FIG. 1 schematically illustrates a wall 10 for a shielding device according to an embodiment of the invention from an elevated view, and FIG. 2 illustrates the same wall 10 in phantom to clearly shown the internal structure of wall 10. In the illustrated embodiment, wall 10 encloses a rectangular area, but it should be noted that the wall may in fact take any shape, and can therefore freely be designed dependent on specific requirements such as the shape of the component or components to be encapsulated. Wall 10 is predominantly formed of a moldable resilient material, preferably a silicone material. Inside wall 10, a number of strings 11 of en electrically conductive material are formed. These strings extend from a lower end 12 of wall 10 to an upper end 13 of wall 10. In the shown embodiment, strings 11 extend substantially straight, and perpendicular to the extension of the wall. It should be noted, though, that strings 11 as well as the cross-section of wall 10 may also be curved. Strings 11 are formed of a concentrated amount of grains or particles comprising a magnetically attractable metal, such as iron, nickel or ferrite. This way, the formation of strings 11 is made possible by means of a magnetic tool as will be described. In order to enhance the conductivity of the strings, the grains or particles may be coated with a layer of e.g. gold, silver or copper.

Figure 3:
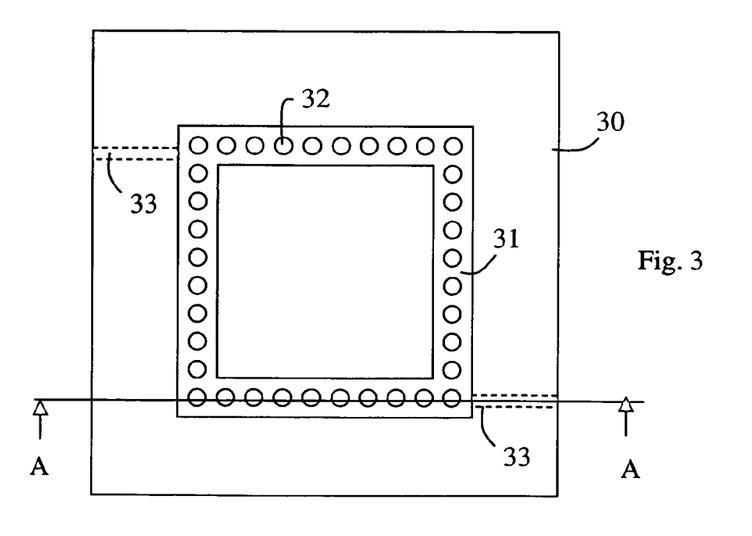
FIG. 3 schematically illustrates a view from above of a mold tool member for manufacturing a wall according to an embodiment of the invention.

FIGS. 3-7 schematically illustrate a mold tool for manufacturing wall 10. In FIG. 3 a mold base 30 is seen from above. Mold base 30 is provided in a non-magnetic material, such as aluminum or stainless steel, and is provided with a groove 31 which defines the shape of the wall to mold. At selected positions in groove 31, magnets 32 are arranged, preferably flush with the bottom of groove 31. One or more conduits 33 are further provided in mold base 30, extending from an outside wall of mold base 30 to groove 31. In the examples shown, conduits 33 extend through mold base 30. As an alternative, a channel may be formed in the surface of mold base 30 between the outside wall of mold base 30 and groove 31, which channel is closed when an opposing mold cover is attached to mold base 30.

Figure 4:
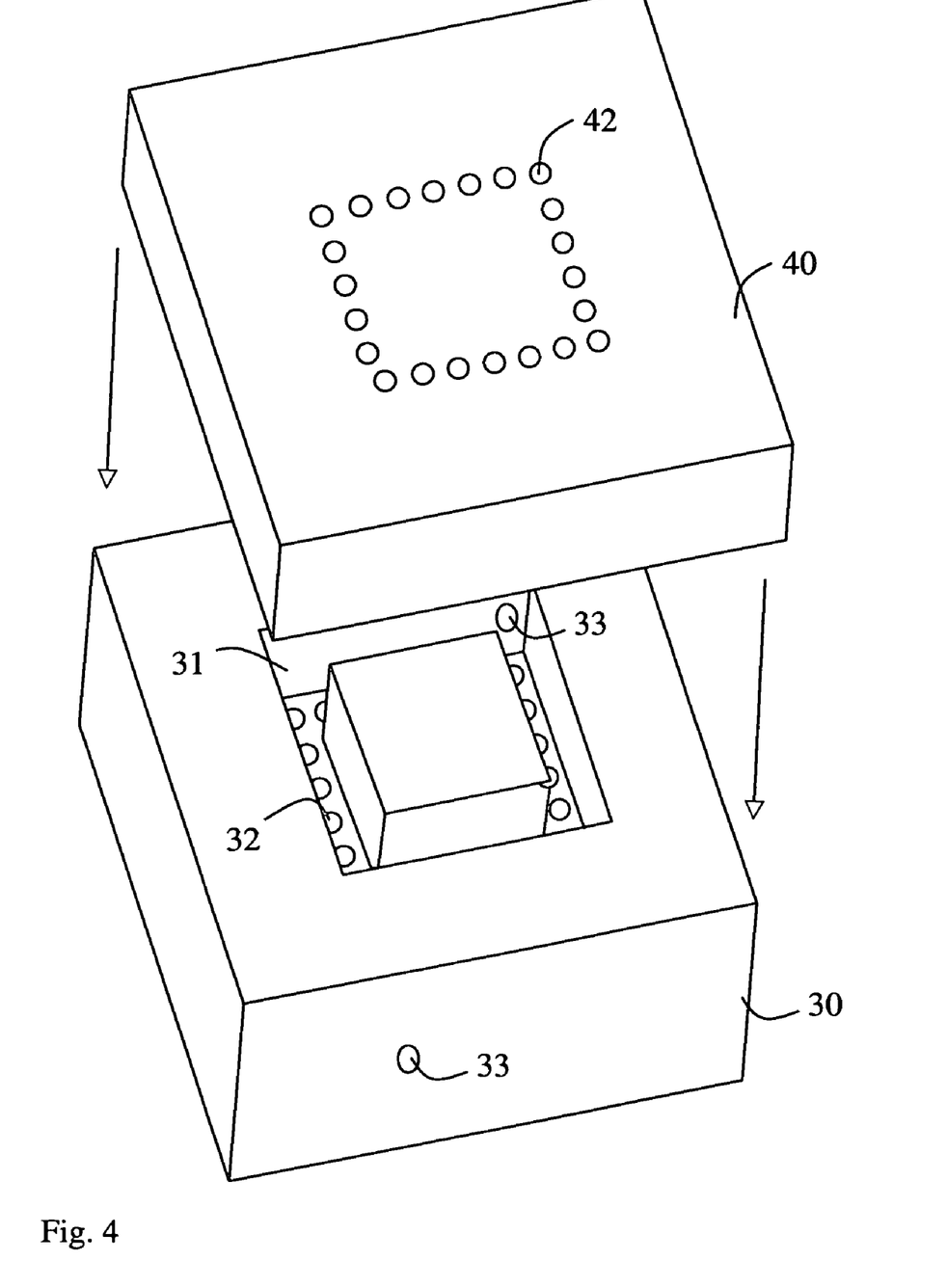
FIG. 4 illustrates the assembly of a mold tool for use in an embodiment of the invention.

FIG. 4 illustrates an elevated view of the mold tool, including mold base 30 and a mold cover 40. Mold cover 40 may also comprise a groove 41 in a similar manner as mold base 30 has groove 31. Alternatively, mold cover 40 may have a flat surface devised to engage mold base 30. Furthermore, mold cover 40 is provided with magnets 42, disposed opposite magnets 32. Guide pins (not shown) or the like are preferably provided to correctly mate mold base 30 and mold cover 40, such that magnets 32 and 42 are properly aligned with each other.

Figure 5:
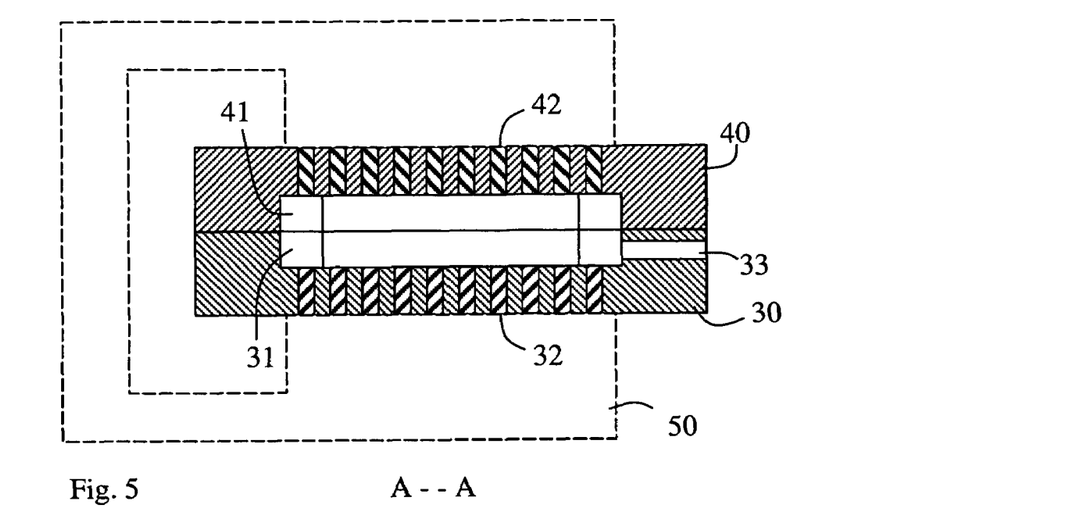
FIGS. 5 and 6 illustrate cross-sectional views of different embodiments of assembled mold tools for use in accordance with the invention.
Figure 6:
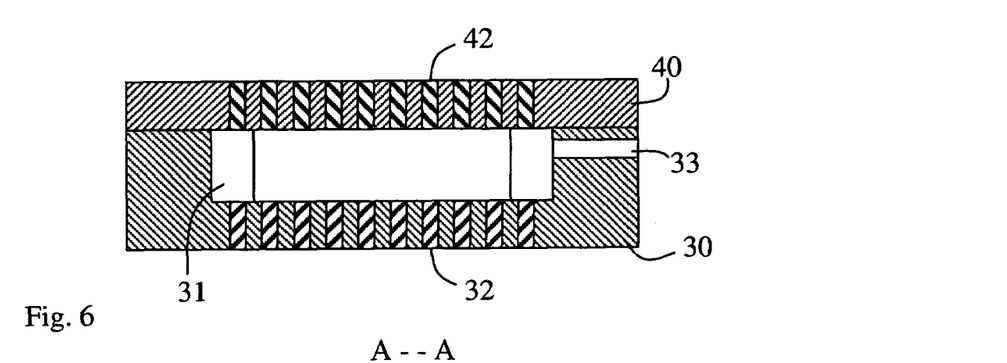

FIGS. 5 and 6 illustrate two embodiments of the mold tool, in which mold base 30 has been engaged with mold cover 40, in a cross-sectional view through A-A of FIG. 3. These drawings clearly shown how magnets 32 and 42 are aligned with respect to each other. Magnets 32 and 42 may be strong permanent magnets, and are in such a case arranged such that magnets 32 are arranged with the north magnetic pole towards the interior of the mold tool, whereas magnets 42 are arranged with the south magnetic pole towards the interior of the mold, or vice versa. In an alternative embodiment, magnets 32 and 42 form end poles of an electromagnet, and are connected by a magnetic yoke 50. Yoke 50 is only schematically illustrated in phantom, and would typically also be provided with windings connected to an electric power supply according to the established art. For the sake of simplicity, yoke 50 is only illustrated in FIG. 5, but may just as well be included in the embodiment of FIG. 6. An advantage with an electromagnet is that the magnetic field may be turned off, thereby simplifying release of the molded wall.

In the embodiment of FIG. 5, mold cover 40 is provided with a recess 41, similar or identical to recess 31 in mold base 30. An advantage with such an embodiment is that after completed molding and separation of base 30 and cover 40, the molded wall will project from mold base 30, or mold cover 40, which makes it easier to release the molded wall from the mold tool.

In the embodiment of FIG. 6, mold cover 40 is substantially flat at its engagement surface towards mold base 30. Such an embodiment is advantageous if the wall to be molded is to be adhered to a shielding cover. When manufacturing a shielding device where wall and cover are joined, a cover of an electrically but non-magnetic material is placed between the mold parts 30 and 40, respectively, before introduction of the molding material. Portions of the shielding cover facing recess 31 may also be provided with an adhering promoter, as is well known in the art of silicone molding.

Figure 7:
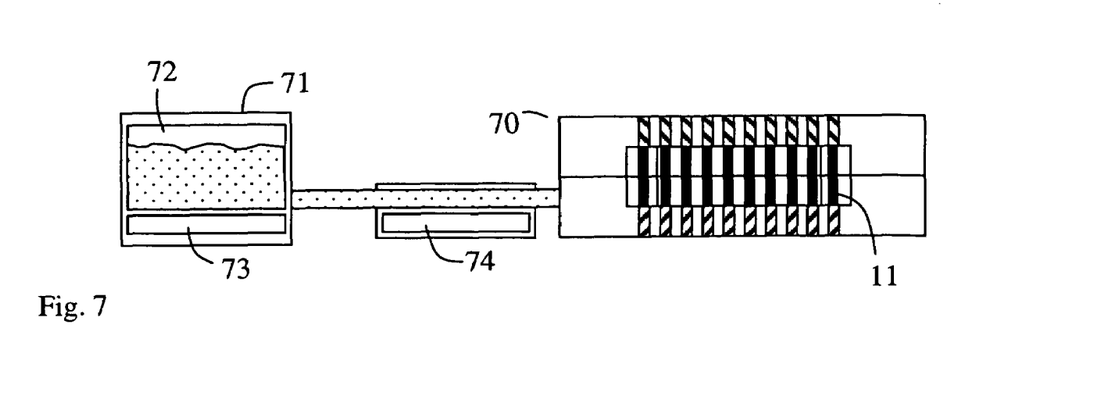
FIG. 7 illustrates a molding system usable for manufacturing a shielding device in accordance with an embodiment of the invention.

FIG. 7 schematically illustrates a molding system according to an embodiment of the invention, comprising a mold tool 70 including opposing mold parts 30 and 40, respectively according to any of the described embodiments, with a plurality of opposing magnets 32 and 42, respectively. A molding material source 71 comprises a molding material container 72 and preferably a first heater device 73. The molding material preferably includes a silicone material, in which a plurality of grains or particles of a magnetically attractable material are dispersed. The amount of particles included is selected dependent on the desired resiliency, and to the structure to form, more specifically the width of strings 11 compared to the pitch between strings 11 and the width of wall 10. As an example, assume that the shielding compartment to be obtained has a height of 2 mm, and covers an area of 1×1 cm. The wall may then be designed to have a thickness of t=1 mm, as defined by the width of groove 31 in the mold tool. The strings 11 to be formed by attraction from magnets 32 and 42, may not be absolutely even, but an average string diameter of d=0.5 mm can be assessed. The pitch between the strings has to be larger than the width of strings 11, and as an example we can assess a pitch of p=1 mm. The volume $V_s$ of the strings could be roughly calculated as $$V_s = h * \pi d^2 / 4,$$

where h is the height of the wall, and the total wall volume could be roughly calculated as $$V_w = h * p * t.$$

The relative volume amount of metal particles in the molding material, for the given example, would then be about $$V_s / V_w = 19.6\%.$$

A possible range for the volume ration is believed to be 5-30%. In any case, a molded element of such a material would be fairly hard if the metal particles were evenly dispersed in the silicone of the final product. However, when the metal particles are concentrated in strings 11 by means of magnetic attraction in the mold tool, the resulting molded element obtains characteristics similar to a studded winter tire. The bulk of the wall will remain soft and resilient, whereas the end portions of the strings will engage the conductive surfaces pressed to the wall ends, whereby good low-resistive electrical contact is obtained without requiring a high compression force.

First heater device 73 is preferably configured to hold a temperature sufficient to make the molding material fluid. Typically, the molding material includes an agent devised to assist cross-linking of the molecules in the molding material when raised above a certain temperature $T_m$, e.g. 120° C. The molding material in container 72 is preferably controlled by first heater device 73 to hold a raised temperature which is still lower than $T_m$. A second heater device 74 may be arranged between container 72 and mold tool 70, configured to raise the temperature another notch immediately before injection of the molding material into mold tool 70. As an example, container 72 may hold 100° C., whereas second heater device 74 is configured to raise the temperature to 120° C. The mold tool 70 as such preferably holds a temperature of 150-180° C., by means of a third heater device (not shown) connected to the mold parts 30 and/or 40. From the molding material source 71, possibly via second heater device 74, the molding material is injected into mold 70 through one or more conduits 33. Silicone typically cross-links very fast, in the range of a minute or so, and the magnetic field between opposing magnets 32 and 42 is therefore preferably present from the start, i.e. before injection. For permanent magnets, this would typically be the case. However, an alternative embodiment may include displaceable permanent magnets 32 and 42, which are displaced towards each other to the position shown in FIGS. 5 and 6, after injection of the molding material. For an electromagnet solution, the magnetic field may selectively by turned on before or after injection of the molding material.

When the molding material is injected and the magnetic field is present between opposing magnets 32 and 42, the magnetically attractable particles dispersed in the molding material will tend to concentrate to strings 11, drawn black in FIG. 7, extending between the opposing magnets. The strings are illustrated in the drawings as cylindrical pillars, but may of course be less even, since the shape is predominantly determined by the shape of the magnetic field.

Once the molding material is solidified, typically by cross-linking, to form the wall 10 with built-in strings 11, the mold tool 70 is opened for removal of the molded wall 10, with or without attached shielding cover.

Figure 8:
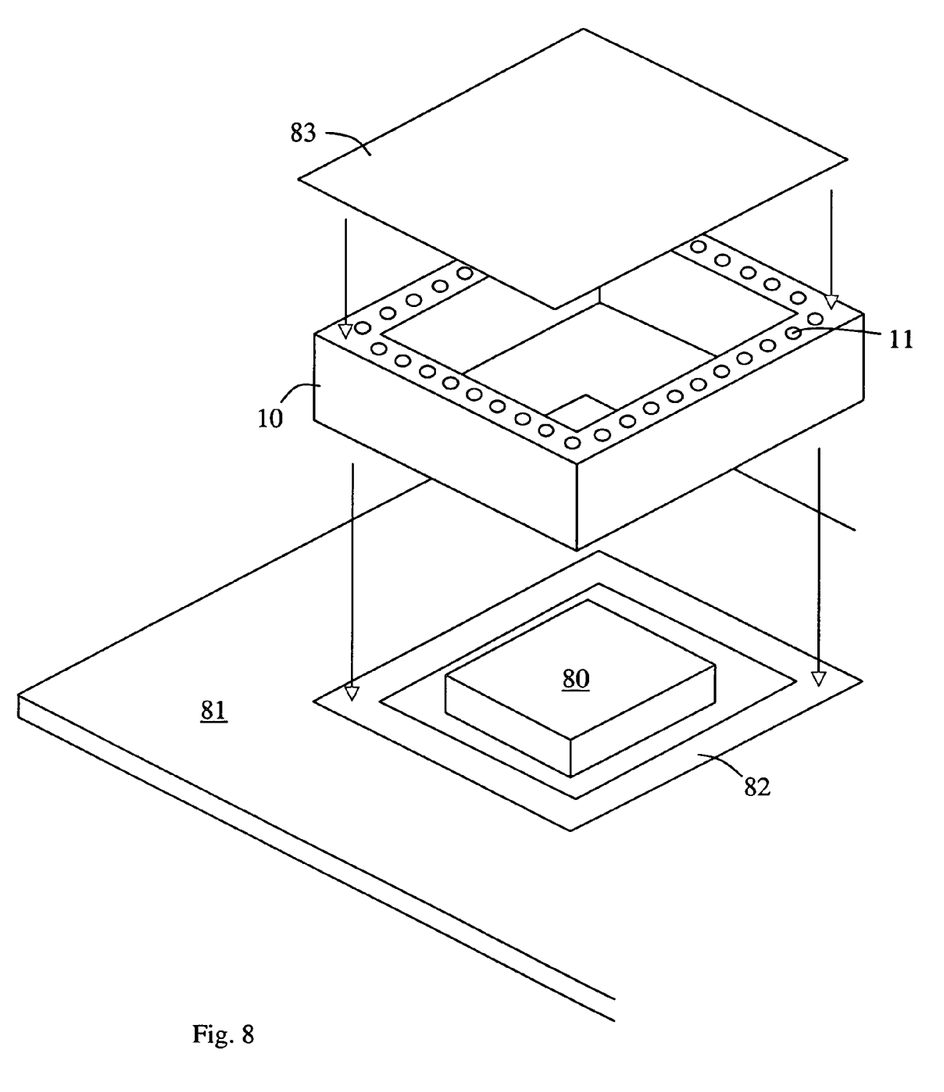
FIG. 8 schematically illustrates an assembly of a shielding device over a component in accordance with an embodiment of the invention.

FIG. 8 illustrates a simple embodiment of application of a shielding device according to an embodiment of the invention. A component 80 is attached to a surface of a carrier 81, such as a PCB. A grounded portion 82 forms a ground trace surrounding component 80. In order to shield off EMI or protect the component from ESD, a wall 10 is placed on top of the ground trace to encompass component 80. Wall 10 has a lower end having a shape corresponding to ground trace 82, such that the lower ends of strings 11 engage ground trace 82. A shielding cover 83 is placed in contact with the upper end of wall 10, such that upper ends of strings 11 are placed in contact with a conductive portion on cover 83. Cover 83 may e.g. be a sheet of metal, or a plastic cover which is metallized by coating. Furthermore, cover 83 may be firmly attached to wall 10 by molding, as described above, by using a conductive adhesive, which is commercially available from e.g. 3M, or simply by pressing the cover into contact with the upper end of wall 10. The cover may be made of a magnetic or a non-magnetic material, but if the wall is molded to the cover it is preferably made of a non-magnetic material. In any case, an attachment member (not shown) is preferably provided to press cover 83 towards carrier 81, to ensure good electrical contact through strings 11. The attachment member may e.g. be a biased spring mechanism provided by a clamp, or indirectly by means of another element such as a battery being pressed against cover 83. Another alternative is to attach the cover 83 to carrier 81 by screws passing through holes in the cover, preferably formed in ears extending outside the perimeter of wall 10.

The invention as described above has many benefits. A wall for a shielding device is obtained which is conductive but softer than conductive gaskets with an even distribution of conductive particles. By arranging the conductive particles in a strings a fence-like structure is obtained within the wall, which will act as a Faraday cage when attached between a ground plane and a cover. The solution is also advantageous compared to soldered solutions, in that the shielding device is easily disassembled when needed. Furthermore, since the wall is molded, its shape can be freely designed with respect to the intended use. In fact, the carrier surface to which the wall is to be attached need not even be flat.

Figure 9:
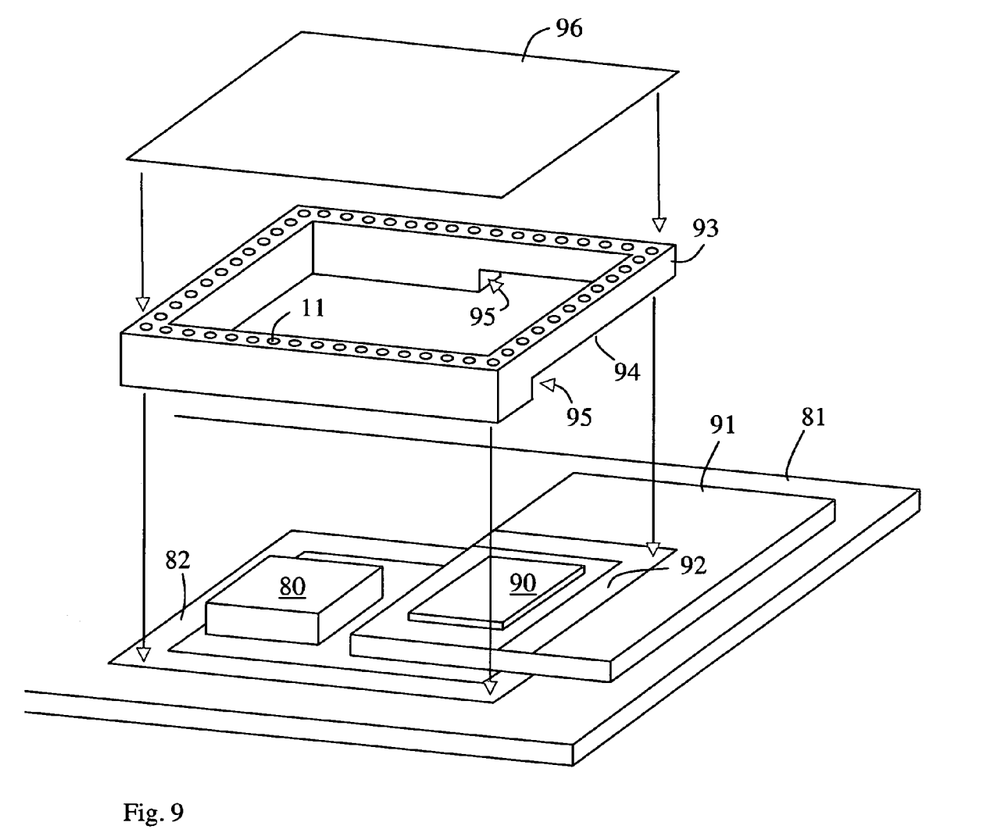
FIG. 9 schematically illustrates an assembly of a shielding device over two components and partly covering two sandwiched PCBs in accordance with an embodiment of the invention.

FIG. 9 schematically illustrates an embodiment of the invention similar to the embodiment of FIG. 8, where a component 80 is attached to a surface of carrier 81, such as a first PCB. Furthermore, a second PCB 91 is attached to the carrier surface of first PCB 81, e.g. by soldering, gluing, screwing or any other suitable way. Second PCB 91 supports a second component 90 on its outer surface. Typically, second PCB 91 includes more components, only second component 90 being shown for the sake of simplicity. As an example, the first PCB 81 is a main PCB for a radio communication terminal such as a mobile phone. Second PCB 91 may be an additional PCB which is separately attached to first PCB 81 in order to adapt the terminal to specific operating conditions of the market in which it is to operate. For instance, component 90 may be a radio component, specifically adapted for use in a certain communication system. By using a main PCB 81 on which all or most of the attached components can be used in a plurality of communication systems with different frequency bands, an adapting the terminal to specific conditions of a certain network by attaching a particular additional PCB 91 to main PCB 81, cost and assembly time can be saved. A grounded portion 82 forms a ground trace partly or completely surrounding component 80. Furthermore, a second ground trace 92 is preferably formed on second PCB 91, which together with first ground trace 82 encompasses both component 80 and component 90. The edge portions of second ground trace 92 may be galvanically connected to first ground trace 82 by soldering at the edge of the second PCB 91, or e.g. by pressing a connection pad (not shown), which is connected to second ground trace 92 but disposed on the backside of second PCB 91, to first ground trace 82. As an alternative, first ground trace 82 is shaped to encompass component 80 on the surface of first PCB 81, whereas second ground trace 92 is shaped to encompass component 90 on the surface of second PCB 91. In order to shield off EMI or protect components 80 and 90 from ESD, a wall 93 is placed on top of the ground traces to encompass components. Wall 93 has a lower end 94 having a shape corresponding to the ground trace 82 and 92, such that the lower ends of strings 11 engage the ground traces. Furthermore, lower end 94 is shaped to climb from the surface of PCB 81 over the edge and onto the surface of second PCB 91. This is achieved by forming wall 93 with shoulder portions 95 dimensioned to the height, or thickness, of second PCB 91. A shielding cover 96 is placed in contact with the upper end of wall 93, such that upper ends of strings 11 are placed in contact with a conductive portion on cover 96. As for the embodiment of FIG. 8, cover 96 may e.g. be a sheet of metal, or a plastic cover which is metallized by coating. Furthermore, cover 96 may be firmly attached to wall 93 in any of the ways described with reference to FIG. 8. Furthermore, the molded wall need not encompass an area as shown in the drawings. Instead, wall 10 may be provided e.g. as a U-shaped wall section to be assembled to a ground trace and also to an upright supplementary wall member forming part of another object, such as another shielding device, wherein the wall section and the supplementary wall together for a closed wall.

Figure 10:
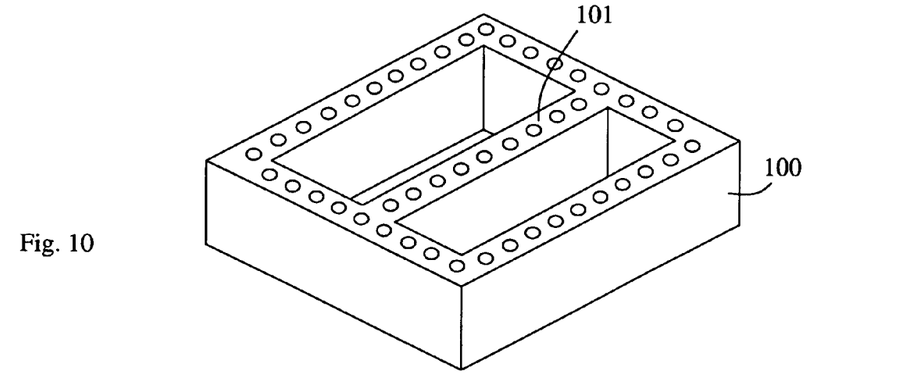
FIG. 10 schematically illustrate a wall forming part of a shielding device according to a variant of the embodiment of FIG. 1, with an interior partition wall separately shielding off two compartments or areas.

In one embodiment as illustrated in FIG. 10, the wall structure 100 includes an internal partition wall 101, also provided with affixed strings 11 as previously described. Such a wall structure can be shaped to encompass a plurality of components separately or in groups, after which a single cover can be placed over the entire wall structure to close separate shielding compartments. As was explained with reference to FIG. 9, one version of such an embodiment may be to provide two separate and closed ground traces 82 and 92, respectively, about the respective components 80 and 90. A wall structure 101 as shown in FIG. 10, further provided with shoulder portions as shown in FIG. 9, may suitable used for such an embodiment.

An example of dimensions for the shielding device have been outlined above. The invention is as such particularly advantageous for compact shields, but it should be noted that the design is in no way restricted to use within any specific dimension ranges. Besides offering good electrical connection to the cover and to the ground portion around the component to be shielded for the purpose of EMI or ESD protection, the resiliency of the molded silicone material offers protection against moisture and dust.

The foregoing has described the principles, preferred embodiments and modes of operation of the present invention. However, the above described embodiments should be regarded as illustrative rather than restrictive, and it should be appreciated that variations may be made in those embodiments by those skilled in the arts without departing from the scope of the present invention as defined in the appended claims.

The inventioned claimed is:

1. Shielding device for an electronic component, comprising
   a wall of a resilient material, having a lower end and an upper end;
   a plurality of particles of a magnetically attractable material, concentrated in strings extending within the wall from the lower end to the upper end;
   a cover having an electrically conductive layer, connected to the strings at the upper end of the wall.

2. The shielding device of claim 1, wherein the wall encompasses an area, and the cover is engaged to the upper end of the wall around that area.

3. The shielding device of claim 1, wherein the cover is a sheet of metal.

4. The shielding device of claim 1, wherein the electrically conductive layer is made of a non-magnetic metal.

5. The shielding device of claim 1, wherein the cover is adhered to the upper end of the wall by means of a conductive adhesive.

6. The shielding device of claim 1, wherein the cover is pressed into engagement with the upper end of the wall by means of an attachment member.

7. The shielding device of claim 1, wherein the plurality of particles are coated with a conduction-enhancing metal layer.

8. The shielding device of claim 1, wherein the plurality of particles are coated with a layer of gold.

9. The shielding device of claim 1, wherein the plurality of particles are coated with a layer of silver.

10. The shielding device of claim 1, wherein the lower and of the wall has a stepper profile defined by a shoulder, configured to engage a stepped carrier surface.

11. The shielding device of claim 1, wherein the wall encompasses an area, and an interior partition wall member divides the area into two separate sub areas.

* * * * *